(12) United States Patent
Mansour et al.

(10) Patent No.: US 10,230,404 B2
(45) Date of Patent: Mar. 12, 2019

(54) FORWARD ERROR CONTROL CODING

(71) Applicant: Texas Instruments Incorporated, Dallas, TX (US)

(72) Inventors: Mohamed Farouk Mansour, Richardson, TX (US); June Chul Roh, Allen, TX (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/580,622

(22) Filed: Dec. 23, 2014

(65) Prior Publication Data

US 2016/0182092 A1 Jun. 23, 2016

(51) Int. Cl.
*H03M 13/00* (2006.01)
*H03M 13/29* (2006.01)
*H03M 13/27* (2006.01)
*H03M 13/09* (2006.01)
*H03M 13/15* (2006.01)

(52) U.S. Cl.
CPC ....... *H03M 13/2957* (2013.01); *H03M 13/27* (2013.01); *H03M 13/2966* (2013.01); *H03M 13/09* (2013.01); *H03M 13/1515* (2013.01); *H03M 13/618* (2013.01)

(58) Field of Classification Search
CPC ..................... H03M 13/2915; H03M 13/2957
See application file for complete search history.

(56) References Cited

U.S. PATENT DOCUMENTS

| | | | | |
|---|---|---|---|---|
| 5,615,221 A * | 3/1997 | Karp | ..................... | H03M 13/00 714/752 |
| 2001/0039637 A1 * | 11/2001 | Bengough | ............. | H03M 13/27 714/752 |
| 2005/0101319 A1 * | 5/2005 | Murali | ................. | H04N 5/4401 455/434 |
| 2005/0276344 A1 * | 12/2005 | Ling | ..................... | H04B 7/0417 375/260 |
| 2008/0098273 A1 * | 4/2008 | Blankenship | ......... | H03M 13/05 714/746 |
| 2008/0298435 A1 * | 12/2008 | Lakkis | ................. | H04J 13/0014 375/140 |
| 2009/0175210 A1 * | 7/2009 | Vijayan | ................. | H04L 1/0065 370/312 |
| 2010/0039286 A1 * | 2/2010 | Robbins | ............... | G01V 11/002 340/855.3 |
| 2010/0235706 A1 * | 9/2010 | Eberlein | ........... | H03M 13/2707 714/752 |
| 2012/0054585 A1 * | 3/2012 | Jiang | ................. | H03M 13/1111 714/777 |
| 2012/0079359 A1 * | 3/2012 | Buckley | ................ | H03M 13/09 714/807 |

\* cited by examiner

*Primary Examiner* — Samir W Rizk
(74) *Attorney, Agent, or Firm* — Kenneth Liu; Charles A. Brill; Frank D. Cimino

(57) ABSTRACT

A system and method for providing error control coding for backhaul applications are disclosed. Data is first encoded using Reed-Solomon (RS) coding. The output RS blocks are then turbo coded. The size of the output RS blocks is selected to match the input of the turbo encoder. The bits from the RS blocks may be interleaved to create the input turbo blocks. Cyclic Redundancy Check (CRC) parity bits may be added to the data prior to RS coding.

20 Claims, 4 Drawing Sheets

FORWARD ERROR CONTROL CODING

BACKGROUND

Wireless users require high-speed connections that support real time video, streaming music, and other multimedia applications. As a result, demands on wireless networks approach the broadband speeds and user experience provided by traditional DSL and cable modem wireline service. Wireless networks continue to evolve to next-generation packet architectures capable of supporting enhanced broadband connections with the introduction of 4G systems.

The higher speeds and capacity provided by 4G wireless networks put strain on backhaul networks and the carriers providing backhaul services as the transport requirements increase. Providers are shifting from traditional TDM transport in 2G and 3G networks to packet transport to support higher data rates, reduce network latency, and support flexible channel bandwidths in 4G networks. The backhaul networks require efficient Bit-Error-Rate (BER) performance to support 4G mobile networks.

SUMMARY OF THE INVENTION

Embodiments provide error control coding mechanisms for backhaul applications. Data is first encoded using Reed-Solomon (RS) coding. The output RS blocks are then turbo coded. The size of the output RS blocks is selected to match the input of the turbo encoder. The bits from the RS blocks may be interleaved to create the input turbo blocks. Cyclic Redundancy Check (CRC) parity bits may be added to the data prior to RS coding.

A transmitter provides forward error correction. The transmitter comprises a CRC parity bit generator that appends CRC bits to incoming data, a RS coder that creates RS blocks from the incoming data and CRC bits, an interleaver that interleaves symbols in the RS blocks to create turbo coder input blocks, and a turbo encoder that uses the turbo coder input blocks to create a signal to be sent to a receiver. The transmitter circuit may comprise a Digital Signal Processor (DSP) that provides hardware for the turbo encoder and CRC parity bit generator. Software instructions running on the DSP may provide the RS coder and the interleaver. The size of the RS blocks may be selected to match the input block size of the turbo coder so that an integer number of RS blocks are interleaved to create the turbo coder input blocks. The interleaver may sequential fill the turbo input blocks with symbols from successive RS blocks. The CRC parity bit generator and the turbo encoder may operate using parameters defined in the LTE standard.

A receiver decodes forward error corrected signals. The receiver comprises a turbo decoder that decodes received signals to create turbo output blocks, a de-interleaver that de-interleaves the turbo output blocks to create RS input blocks, a Reed-Solomon decoder that receives the RS input blocks and generates decoded output data, and a CRC parity bit check circuit that evaluates CRC bits in the decoded data. The receiver may further comprise a DSP that provides hardware for the turbo decoder and CRC parity bit check circuit. Software instructions running on the DSP may provide the RS decoder and the de-interleaver. The size of the RS blocks may be selected to match the output block size of the turbo decoder so that an integer number of RS blocks are de-interleaved from the turbo decoder output blocks.

BRIEF DESCRIPTION OF THE DRAWINGS

Figure 1:
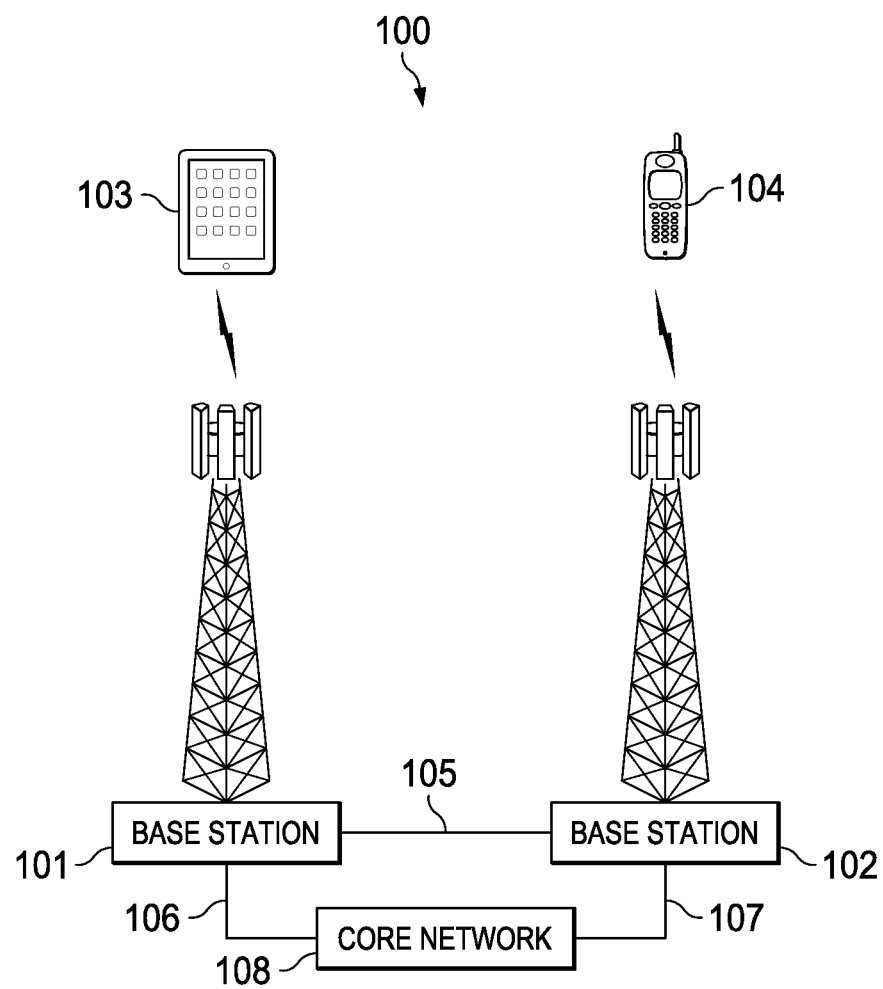
Figure 2:
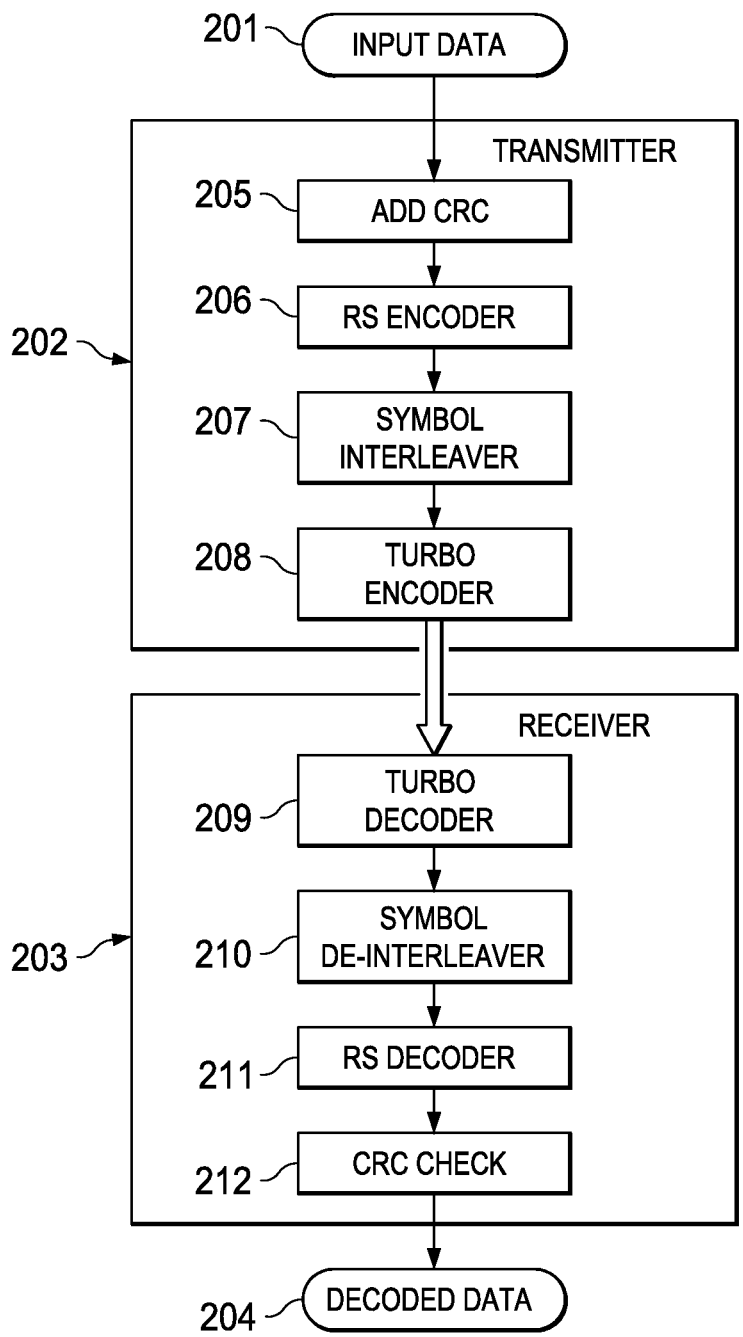
Figure 3:
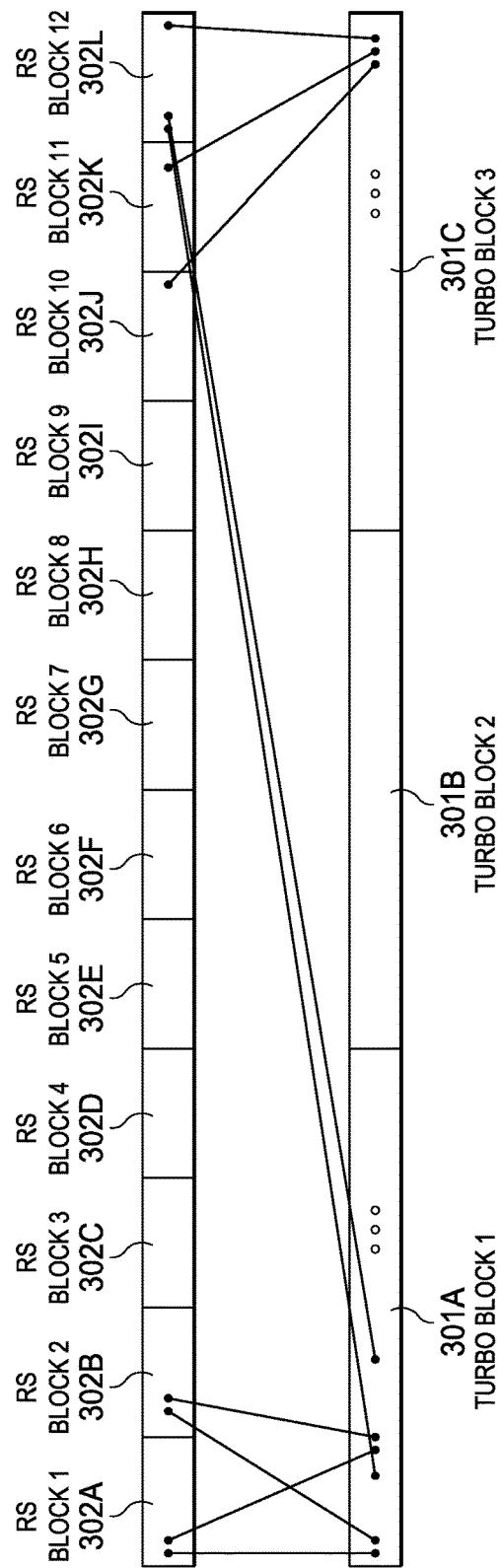
Figure 4:
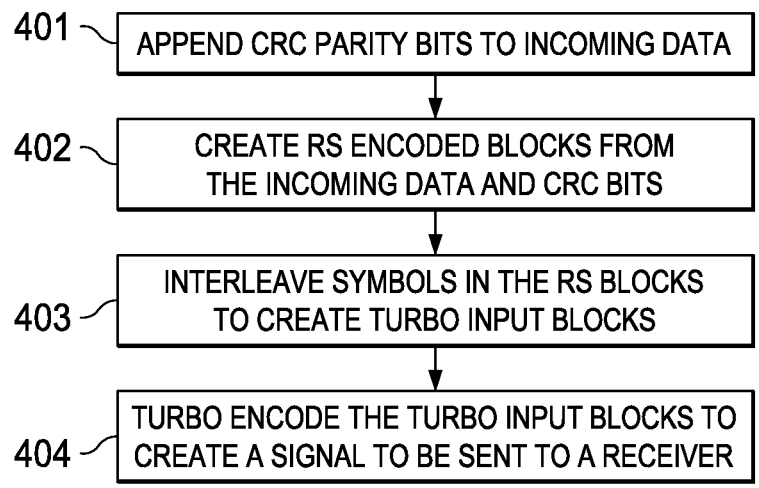
Figure 5:
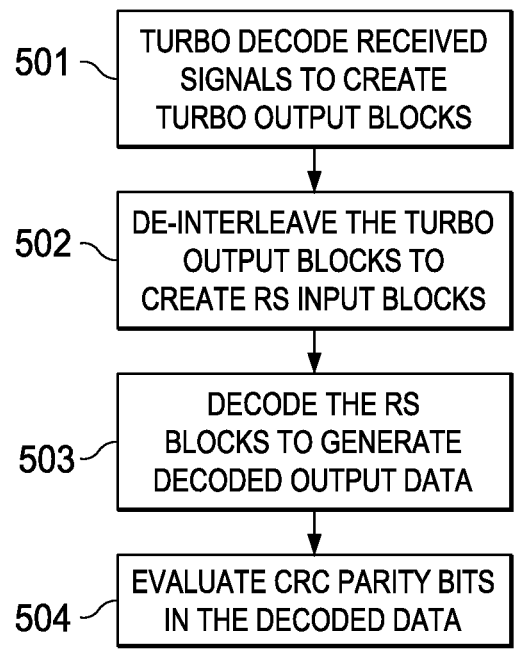

Having thus described the invention in general terms, reference will now be made to the accompanying drawings, wherein:

FIG. 1 is highly simplified block diagram of a system that may incorporate embodiments of the invention;

FIG. 2 is a block diagram of a system using a combination of RC coding and turbo coding according to one embodiment;

FIG. 3 illustrates interleaver operation in an embodiment with example block size 6144 and three turbo blocks;

FIG. 4 is a flowchart illustrating a method for encoding data to provide forward error correction according to one embodiment; and FIG. 5 is a method for decoding forward error corrected signals according to one embodiment.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is a highly simplified block diagram of a system 100 which is part of a cellular communications network, such as a 3GPP Long Term Evolution (LTE) network. Base stations 101, 102 serve user equipment (UE) 103, 104 and other devices (not shown). Base stations 101, 102 may be, for example, LTE eNodeBs. Backhaul links 105-107 allow bases stations 101, 102 to communicate with each other or with core network 108.

Channel coding between base stations and UEs in an LTE network includes CRC and turbo coding schemes. LTE adopts turbo coding as the channel coding for the Physical Downlink Shared Channel (PDSCH), for example. Turbo coding provides sufficient BER for communications between base stations and UEs, but a more efficient BER is required for backhaul links 105-107.

Because turbo coding processors are already present in LTE base stations for use in UE communications, this available hardware can be incorporated into the design of error control coding for backhaul systems. LTE turbo codes may be used as the core part for error control coding. To cope with the error floor for turbo codes at high Signal-to-Noise Ratio (SNR), an outer code may be used to remove the residual errors of turbo codes. In embodiments disclosed herein, the RS block code is selected as the outer code for a Forward Error Correction (FEC) system. RS code offers excellent error correcting capability and has the maximum code rate for the number of corrected symbols.

FIG. 2 is a block diagram of a system using a combination of RS coding and turbo coding according to one embodiment. Input data 201 is received at transmitter 202, which applies FEC coding and transmits the data to receiver 203. Receiver 203 decodes the data to generate received decoded data 204. Transmitter 202 may be in base station 101, for example, and may use FEC for data sent over backhaul link 105 to base station 102 which includes receiver 203.

Transmitter 202 FEC adds CRC in block 205 and then RS encoding in block 206. To maximize concatenation gain, a symbol interleaver 207 is used between turbo encoder 208 and the RS encoder 206 so that symbol errors from the turbo code are dispersed between more than one RS code. This maximizes the error correcting capability of the concatenated code. In one embodiment, turbo encoder 208 may be a turbo hardware accelerator in an LTE base station. The RS encoder 206 and symbol interleaver 207 may be performed by software on the same DSP as the turbo hardware accelerator. In one embodiment, a single DSP core is dedicated to FEC processing to minimize data transfer among components in the transmitter. The output of turbo decoder 208 is transmitted to receiver 203.

Receiver 203 decodes the data received from transmitter 202. Received signals are processed in turbo decoder 209 and then symbol de-interleaver 210. The signal is then RS decoded in block 211 and CRC checked in block 212 to generate received decoded data 204. Similar to transmitter 202, turbo decoder 209 may be a turbo hardware accelerator DSP in an LTE base station, while the symbol de-interleaver 210 and RS decoder 211 may be performed by software on the same DSP as the turbo hardware accelerator. In one embodiment, a single DSP core is dedicated to error correction processing to minimize data transfer among components in the receiver.

The parameters used for the turbo+RS concatenated code may be selected to facilitate reuse of the hardware turbo modules in an LTE base station. LTE turbo code with code rate matching may be used to provide a near continuous range of code rates in the Modulation and Coding Scheme (MCS) table. In one embodiment, three block size of turbo codes {6144, 3072, 1024} may be used to provide a compromise between the performance and latency of FEC encoding/decoding. Additionally, the maximum number of turbo iterations is varied to improve this tradeoff. The exact output block size of the turbo encoder is varied to achieve maximum efficiency of the frame structure and minimize the number of unused filler bits.

The output block size of RS codes from RS encoder 206 should match the input block size of turbo codes in turbo encoder 208. The RS code is specified by three parameters (n,k,t), where n is the output block size (in symbols), k is the input block size in symbols, and t is the number of symbol errors that can be corrected. The three parameters are related where k=n−2t. To simplify software implementations of the RS encoder/decoder, RS over the field GF(28) may be used so that the code symbols correspond to whole bytes. Two shortened RS codes may be used: (192,184,4) and (128,122, 3). The first code (192,184,4) is used with turbo block sizes 6144 and 3072 bits. The second code (128,122,3) is used with turbo block size 1024 bits.

Table 1 lists RS codes for different turbo block sizes. For a turbo block size of 6144, there are four RS blocks of the constituent code (192,184,4) per a single turbo block. For a turbo block size of 3072, there are two RS blocks of the constituent code (192,184,4). For a turbo block of size 1024, there is a single RS block of the constituent code (128,122, 3).

TABLE 1

| Turbo Block Size (bits) | RS Code | Number of RS blocks per Turbo block |
| --- | --- | --- |
| 6144 | (192, 184, 4) | 4 |
| 3072 | (192, 184, 4) | 2 |
| 1024 | (128, 122, 3) | 1 |

The input data block to the RS encoder is appended by CRC parity bits for error detection at the receiver. In one embodiment, a CRC accelerator on a bit rate coprocessor (BCP) for CRC encoder/decoder is used. The length of the CRC parity bits depends on the size of the turbo block size. The CRC polynomials for LTE may be used for generating the parity bits. Table 2 lists the length of the CRC parity check bits for the turbo block sizes used in the example of Table 1.

TABLE 2

| Turbo Block Size (bits) | Length of CRC Parity Bits |
| --- | --- |
| 6144 | 24 |
| 3072 | 16 |
| 1024 | 8 |

The possible information block sizes for different turbo block sizes are summarized in Table 3. The information data block size is the turbo block size minus parity bits of the RS minus the CRC bits.

TABLE 3

| Turbo Block Size (bits) | Length of Information Block Size (bits) |
| --- | --- |
| 6144 | 5864 |
| 3072 | 2928 |
| 1024 | 968 |

To increase the FEC efficiency, multiple turbo blocks may be interleaved together before RS encoding. This distributes the turbo decoder error among more turbo blocks for more error protection. Up to three turbo blocks may be interleaved together, and the corresponding number of RS block is multiplied accordingly.

As illustrated in FIG. 2, the FEC encoder is comprised of four components: CRC generator, RS encoder, interleaver, and Turbo encoder.

The length of the CRC parity bits depends on the turbo block size as illustrated in Table 2. The generator polynomials from the LTE standard may be used for the different size CRC generation:

$g_{crc24} = D^{24} + D^{23} + D^{18} + D^{17} + D^{14} + D^{11} + D^{10} + D^{7} + D^{6} + D^{5} + D^{4} + D^{3} + D + 1$ $g_{crc16} = D^{16} + D^{12} + D^{5} + 1$ $g_{crc8} = D^{8} + D^{7} + D^{4} + D^{3} + D + 1$ The encoding and decoding is done similar to LTE to enable the reuse of the hardware accelerator.

After adding the CRC parity bits, the input block size is segmented to RS blocks. The number of RS blocks depends on the turbo block size and the number of turbo blocks. For example, with three turbo blocks of size 6144, then there are a total of 12 RS (192,184,4) blocks; or with one turbo block of size 1024, then there is one RS (128,122,3) block.

The interleaver maps the output RS blocks to the input of turbo blocks. The objective of the interleaver is to spread any possible error from the turbo decoder among as many RS blocks as possible to maximize the correcting probability. The RS output is in symbols (i.e., 8 bits), while the unit in the turbo block is a bit.

FIG. 3 illustrates the interleaver operation in an embodiment with block size 6144 and three turbo blocks 301A-C. In this example, there are a total of 12 RS blocks (192,184,4) 302A-L. The turbo blocks 301A-C are filled sequentially by symbols from successive RS blocks 302A-L. For example, the first 8 bits in the first turbo block 301A are from the first symbol (i.e., 8 bits) of the first RS block 302A, the second 8 bits of the first turbo block 301A are the first output symbol from the second RS block 302B, and the 12$^{th}$ set of 8 bits in the first turbo block 301A are the first output symbol in the 12$^{th}$ RS block 302L, and so on as shown in FIG. 3. The whole eight bits of each RS symbol are sequentially placed in the corresponding locations in the turbo block.

This interleaving may be described algebraically as follows. Assume M turbo blocks of length L bits and N RS blocks per turbo block each RS block has output size of K=L/8N symbols. The output symbols of all RS blocks may be arranged in a matrix of size MN×K. Each row contains the output symbols of the corresponding RS block. The matrix may be converted to a column vector by raster scanning column wise (i.e., first column then second column and so on). The vector of symbols is then converted to a vector of bits by expanding each symbol to 8 bits. This generates long vector of length LM bits. The vector is then converted to a matrix of size L×M with each column corresponding to an input turbo block of size L bits.

The turbo encoding may be performed using a bit rate coprocessor hardware accelerator. An LTE rematching module may be used to generate the exact output block size as described in the MCS table. The RS encoder uses standard shortened RS blocks as specified in Table 1.

FIG. 4 is a flowchart illustrating a method for encoding data to provide forward error correction according to one embodiment. In step 401, CRC parity bits are appended to incoming data. In step 402, RS encoded blocks are created from the incoming data and CRC bits. In step 403, symbols in the RS blocks are interleaved to create turbo input blocks. The interleaving may sequential fill the turbo input blocks with symbols from successive RS blocks. In step 404, the turbo input blocks are turbo encoded to create a signal to be sent to a receiver.

The CRC parity bits and turbo encoding of the input blocks may be performed using DSP hardware. Software instructions on the DSP may be used to create the RS encoded blocks and interleave the RS blocks. The size of the RS blocks may be selected to match the input block size of the turbo coder so that an integer number of RS blocks are interleaved to create the turbo coder input blocks. The CRC parity bits and the turbo encoder operation may be compatible with the LTE standard.

FIG. 5 is a method for decoding forward error corrected signals according to one embodiment. In step 501, received signals are turbo decoded to create turbo output blocks. In step 502, the turbo output blocks are de-interleaved to create RS input blocks. In step 503, the RS input blocks are RS decoded to generate decoded output data. In step 504, CRC parity bits in the decoded data are evaluated.

The turbo decoding and evaluating CRC parity bits may be performed by DSP hardware. Software instructions executing on the DSP may decode the RS input blocks and de-interleave the turbo output blocks. The size of the RS blocks is selected to match the output block size of the turbo decoder so that an integer number of RS blocks are de-interleaved from the turbo decoder output blocks.

Although the detailed example described above is used in connection with an LTE system, it will be understood that embodiments may be used with systems complying with any wireless protocol or standard.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A transmitter circuit configured to provide forward error correction, the transmitter circuit comprising:
    a Cyclic Redundancy Check (CRC) parity bit generator that appends CRC bits to each incoming data block of a set of incoming data;
    a Reed-Solomon (RS) coder that creates RS blocks from the incoming data and the CRC bits;
    an interleaver that interleaves symbols in the RS blocks to create turbo input blocks; and
    a turbo encoder that uses the turbo input blocks to create a signal to be sent to a receiver, wherein the length of the CRC bits appended to each incoming data block is based at least partially upon the turbo input block size.

2. The transmitter circuit of claim 1, wherein there are M turbo blocks of length L bits and N RS blocks per turbo coder input block such that each RS block has an output size (K) of K=L/8N symbols, wherein output symbols of the RS blocks are arranged in a matrix of size MN×K, wherein each row of the matrix contains output symbols of a corresponding RS block, and wherein the interleaver is further configured to convert the matrix into a symbol vector by raster scanning column wise, and wherein the interleaver is configured to convert the symbol vector into a bit vector by expanding each symbol to 8 bits to generate a long vector of length LM bits.

3. The transmitter circuit of claim 2, wherein the interleaver is configured to convert the long vector into a matrix of size L×M with each column corresponding to an input turbo block of size L bits.

4. The transmitter circuit of claim 1, wherein the size of the RS blocks is selected to match the input block size of the turbo coder so that an integer number of RS blocks are interleaved to create the turbo coder input blocks.

5. The transmitter circuit of claim 1, wherein the interleaver sequentially fills the turbo input blocks with symbols from successive RS blocks.

6. The transmitter circuit of claim 1, wherein the CRC parity bit generator and the turbo encoder operate using parameters defined in a Long Term Evolution (LTE) standard.

7. A method for encoding data to provide forward error correction, the method comprising:
    using a processor of a data transmitter system to:
    append Cyclic Redundancy Check (CRC) parity bits to each incoming data block of a set of incoming data;
    create Reed-Solomon (RS) encoded blocks from the incoming data and the CRC bits;
    interleave symbols in the RS blocks to create turbo input blocks;
    turbo encode the turbo input blocks to create a signal to be sent to a receiver, wherein the length of the CRC bits appended to each incoming data block is based at least partially upon the turbo input block size; and
    cause the signal to be transmitted to the receiver.

8. The method of claim 7, wherein there are M turbo blocks of length L bits and N RS blocks per turbo input block such that each RS block has an output size (K) of K=L/8N symbols, wherein output symbols of the RS blocks are arranged in a matrix of size MN×K, wherein each row of the matrix contains output symbols of a corresponding RS block, and wherein interleaving further comprises: converting the matrix into a symbol vector by raster scanning column wise; and converting the symbol vector into a bit vector by expanding each symbol to 8 bits to generate a long vector of length LM bits.

9. The method of claim 8, wherein interleaving further comprises converting the long vector into a matrix of size L×M with each column corresponding to an input turbo block of size L bits.

10. The method of claim 7, wherein the size of the RS blocks is selected to match the input block size of the turbo coder so that an integer number of RS blocks are interleaved to create the turbo coder input blocs so that an integer number of RS blocks are interleaved to create the turbo coder input blocks.

11. The method of claim 7, wherein the interleaving sequentially fills the turbo input blocks with symbols from successive RS blocks.

12. The method of claim 7, wherein the CRC parity bits are generated and the turbo encoder operates using parameters defined in a Long Term Evolution (LTE) standard.

13. A receiver circuit configured to decode forward error corrected signals, the receiver circuit comprising:
- a turbo decoder that decodes received signals to create turbo output blocks;
- a de-interleaver that de-interleaves the turbo output blocks to create Reed-Solomon (RS) input blocks;
- a Reed-Solomon decoder that receives the RS input blocks and generates decoded output data; and
- a Cyclic Redundancy Check (CRC) parity bit check circuit that evaluates CRC bits in the decoded output data, wherein the length of the CRC bits in the decoded output data is based at least partially upon the turbo output block size.

14. The receiver circuit of claim 13, further comprising:
- a Digital Signal Processor (DSP) that provides hardware for the turbo decoder and CRC parity bit check circuit.

15. The receiver circuit of claim 14, further comprising:
software instructions running on the DSP to provide the RS decoder and the de-interleaver.

16. The receiver circuit of claim 13, wherein the size of the RS blocks is selected to match the output block size of the turbo decoder so that an integer number of RS blocks are de-interleaved from the turbo decoder output blocks.

17. A method for decoding forward error corrected signals, the method comprising:
receiving, by a data receiver system, signals in a transmission; and
using a processor of the data receiver system to:
turbo decode the received signals to create turbo output blocks;
de-interleave the turbo output blocks to create Reed-Solomon (RS) input blocks;
Reed-Solomon decode the RS input blocks to generate decoded output data; and
evaluate Cyclic Redundancy Check (CRC) parity bits in the decoded output data, wherein the length of the CRC bits in the decoded output data is based at least partially upon the turbo output block size.

18. The method of claim 17, further comprising:
turbo decoding the received signals and evaluating CRC parity bits and using Digital Signal Processor (DSP) hardware.

19. The method of claim 18, further comprising:
executing software instructions on the DSP to decode the RS input blocks and to de-interleave the turbo output blocks.

20. The method of claim 17, wherein the size of the RS blocks is selected to match the output block size of the turbo decoder so that an integer number of RS blocks are de-interleaved from the turbo decoder output blocks.

* * * * *